(12) United States Patent
Xiao et al.

(10) Patent No.: US 10,566,506 B2
(45) Date of Patent: Feb. 18, 2020

(54) PACKAGING METHOD AND PACKAGE STRUCTURE OF QLED DEVICE

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Yadan Xiao, Guangdong (CN); Shibo Jiao, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 51 days.

(21) Appl. No.: 15/579,557

(22) PCT Filed: Nov. 15, 2017

(86) PCT No.: PCT/CN2017/110991
§ 371 (c)(1),
(2) Date: Dec. 4, 2017

(87) PCT Pub. No.: WO2019/071703
PCT Pub. Date: Apr. 18, 2019

(65) Prior Publication Data
US 2019/0189869 A1 Jun. 20, 2019

(30) Foreign Application Priority Data
Oct. 9, 2017 (CN) .......................... 2017 1 0931768

(51) Int. Cl.
H01L 29/06 (2006.01)
H01L 33/56 (2010.01)
(Continued)

(52) U.S. Cl.
CPC .............. *H01L 33/56* (2013.01); *H01L 33/06* (2013.01); *H01L 33/641* (2013.01); *H01L 27/15* (2013.01);
(Continued)

(58) Field of Classification Search
CPC ....... H01L 33/56; H01L 33/06; H01L 33/641; H01L 51/52; H01L 27/15
See application file for complete search history.

(56) References Cited

U.S. PATENT DOCUMENTS

2016/0104867 A1* 4/2016 Lee .................... H01L 51/5234
257/40
2017/0082896 A1 3/2017 Jang et al.
2018/0138434 A1* 5/2018 Yoon .................... H01L 51/502

FOREIGN PATENT DOCUMENTS

| CN | 106633887 | 5/2017 |
| CN | 106753208 | 5/2017 |
| CN | 106972113 | 7/2017 |

* cited by examiner

Primary Examiner — Samuel A Gebremariam
(74) Attorney, Agent, or Firm — Hemisphere Law, PLLC; Zhigang Ma

(57) ABSTRACT

The present disclosure provides a packaging method and a package structure of a QLED device. The packaging method of the QLED device forming a thin film encapsulation layer in which a plurality of inorganic barrier layers and at least one organic buffer layer are arranged alternately on a QLED device to seal the QLED device against water and oxygen, and the organic buffer layer is further doped with a thermal conducting material, so that the heat generated by the QLED device can be promptly transmitted through the thin film encapsulation layer to improve the heat dissipation of the thin film encapsulation layer, thereby improving the light extraction efficiency and the service life of the QLED device.

4 Claims, 3 Drawing Sheets

(51) Int. Cl.
  *H01L 33/06* (2010.01)
  *H01L 33/64* (2010.01)
  *H01L 27/15* (2006.01)
(52) U.S. Cl.
  CPC .................. *H01L 2933/005* (2013.01); *H01L 2933/0075* (2013.01)

PACKAGING METHOD AND PACKAGE STRUCTURE OF QLED DEVICE

RELATED APPLICATIONS

The present application is a National Phase of International Application Number PCT/CN2017/110991, filed on Nov. 15, 2017, and claims the priority of China Application No. 201710931768.4, filed on Oct. 9, 2017.

FIELD OF THE DISCLOSURE

The present disclosure relates to a display device packaging field, and more particularly to a packaging method and a package structure of a QLED device.

BACKGROUND OF THE DISCLOSURE

Organic Light Emitting Display (OLED) has the advantages of self-luminous, low driving voltage, high luminous efficiency, short response time, sharpness and contrast, nearly 180° viewing angle, wide temperature range, flexible display and large-area full-color display. It is recognized as the most promising display device in the industry.

The lighting principle of the OLED device is: the semiconductor material and the organic light emitting material cause light emission through the carrier injection and recombination driven by the electric field. Specifically, the OLED device usually adopts an indium tin oxide (ITO) electrode and a metal electrode as the anode and the cathode of the device respectively. Under a certain voltage, electrons and holes are injected into the electron transport layer and the hole transport layer from the cathode and the anode, respectively, and the electrons and holes migrate to the light-emitting layer through the electron transport layer and the hole transport layer, respectively, and meet in the light-emitting layer to form excitons and excite the light-emitting molecules that emit visible light through radiation relaxation.

Quantum dots (QDs) are nanocrystalline particles with a radius less than or close to the Boltz excimer radius and typically have a particle size between 1-20 nm. Quantum dots have a quantum confinement effect that emits fluorescence when excited. Moreover, quantum dots have unique luminescence properties such as wide excitation peak width, narrow emission peak and tunable luminescence spectrum, which make them promising applications in the field of photo-luminescence. Quantum dot light-emitting diode (QLED) is an electroluminescent device using quantum dot as a light-emitting layer. A quantum dot light-emitting layer is introduced between different conductive materials to obtain light of a desired wavelength. After more than two decades of development, quantum dot light-emitting diodes have become potential competitors for the next generation of display technologies due to their tunable size, tunable wavelength, half-width of the emission spectrum very narrow, large color gamut, high electroluminescence efficiency and reduced loss in solution process.

However, the QLED device is very sensitive to water and oxygen, and is highly susceptible to water and oxygen in the surrounding environment to cause device failure. Therefore, the QLED device needs a very high hermetic package structure. However, the high hermetic package structure will lead to the device cooling difficulties, which seriously hampered the efficiency and life expectancy. Therefore, how to ensure that the device has both sealing and heat dissipation has become an urgent problem to be solved in the package structure.

SUMMARY OF THE DISCLOSURE

An object of the present disclosure is to provide a packaging method for a QLED device, which can timely and effectively derive the heat generated by the QLED device while ensuring the sealing performance and the light extraction efficiency, so as to improve the stability of the device and prolong the service life of the QLED device.

Another object of the present disclosure is to provide a package structure of a QLED device which has a high barrier to water and oxygen and the heat generated by the QLED device can be promptly and effectively exported, thus improve the stability of the device, prolong the service life of QLED device.

To achieve the above object, the present disclosure firstly provides a method for packaging a QLED device, including the following steps:

Step 1, providing a base substrate and forming a QLED device on the base substrate; and Step 2, forming a thin film encapsulation layer on the QLED device and the base substrate, wherein the thin film encapsulation layer includes a plurality of inorganic barrier layers and at least one organic buffer layer arranged alternately; and the organic buffer layer is doped with a thermal conductive material.

The specific method for forming the thin film encapsulation layer in the step 2 further includes forming an inorganic barrier layer on the QLED device and the base substrate; forming an organic buffer layer on the inorganic barrier layer; repeating the above manufacturing steps to form a thin film encapsulation layer with a plurality of inorganic barrier layers and at least one organic buffer layer arranged alternately.

The thermal conductive material is graphene oxide; and the mass fraction of the thermal conductive material in the organic buffer layer is less than or equal to 5%.

The method of forming the organic buffer layer includes forming an organic film layer on the inorganic barrier layer by screen printing, spin coating, inkjet printing or film casting with a mixture of a thermal conductive material, an organic substance and an organic solvent, and curing the organic film layer to obtain the organic buffer layer; wherein the organic substance is a combination of one or more of an epoxy resin, a silicon-based polymer and polymethylmethacrylate, and the organic solvent is ethanol, toluene, phenol, or anisole.

The thickness of the organic buffer layer is 500-2000 nm.

The present disclosure further provides a QLED package structure, including:

a base substrate;

a QLED device arranged on the base substrate;

a thin film encapsulation layer arranged on the base substrate and covered the QLED device;

wherein the thin film encapsulation layer includes a plurality of inorganic barrier layers and at least one organic buffer layer arranged alternately;

the organic buffer layer is doped with a thermal conductive material.

The thickness of the organic buffer layer is 500-2000 nm.

The organic substance in the organic buffer layer is a combination of one or more of epoxy resin, silicon-based polymer and polymethylmethacrylate.

The thermal conductive material is graphene oxide; and the mass fraction of the thermal conductive material in the organic buffer layer is less than or equal to 5%.

One of the thin film encapsulation layers near the QLED device is an inorganic barrier layer.

The present disclosure further provides a method for packaging a QLED device, including the following steps:

Step 1, providing a base substrate and forming a QLED device on the base substrate; and Step 2, forming a thin film encapsulation layer on the QLED device and the base substrate; wherein the thin film encapsulation layer includes a plurality of inorganic barrier layers and at least one organic buffer layer arranged alternately; and the organic buffer layer is doped with a thermal conductive material.

wherein, the specific method for forming the thin film encapsulation layer in the step 2 further includes forming an inorganic barrier layer on the QLED device and the base substrate; forming an organic buffer layer on the inorganic barrier layer; repeating the above manufacturing steps to form a thin film encapsulation layer with a plurality of inorganic barrier layers and at least one organic buffer layer arranged alternately;

wherein the thermal conductive material is graphene oxide; and the mass fraction of the thermal conductive material in the organic buffer layer is less than or equal to 5%;

wherein the specific method of forming the organic buffer layer is: forming an organic film layer on the inorganic barrier layer by screen printing, spin coating, inkjet printing or film casting with a mixture of a thermal conductive material, an organic substance and an organic solvent, and curing the organic film layer to obtain the organic buffer layer; the organic substance is a combination of one or more of an epoxy resin, a silicon-based polymer and polymethylmethacrylate, and the organic solvent is ethanol, toluene, phenol, or anisole;

wherein the thickness of the organic buffer layer is 500-2000 nm,

The beneficial effects of the present disclosure are as follows: the method for packaging a QLED device provided by the present disclosure forms a thin film encapsulation layer in which a plurality of inorganic barrier layers and at least one organic buffer layer are alternately stacked on a QLED device to seal the QLED device against water and oxygen, and the organic buffer layer is further doped with a thermal conducting material, so that the heat generated by the QLED device can be promptly transmitted through the thin film encapsulation layer to improve the heat dissipation of the thin film encapsulation layer, thereby improving the light extraction efficiency and the service life of the QLED device. The package structure of the QLED device provided by the present disclosure forms a thin film encapsulation layer in which a plurality of inorganic barrier layers and at least one organic buffer layer are alternately stacked on a QLED device to seal the QLED device against water and oxygen, and the organic buffer layer is further doped with a thermal conducting material, so that the heat generated by the QLED device can be promptly transmitted through the thin film encapsulation layer to improve the heat dissipation of the thin film encapsulation layer, thereby improving the light extraction efficiency and the service life of the QLED device,

BRIEF DESCRIPTION OF THE DRAWINGS

For further understanding of the features and technical contents of the present disclosure, reference should be made to the following detailed description and accompanying drawings of the present disclosure. However, the drawings are for reference only and are not intended to limit the present disclosure.

DETAILED DESCRIPTION OF PREFERRED EMBODIMENTS

To further illustrate the technical means adopted by the present disclosure and the effects thereof, the following describes in detail the preferred embodiments of the present disclosure and the accompanying drawings.

Figure 1:
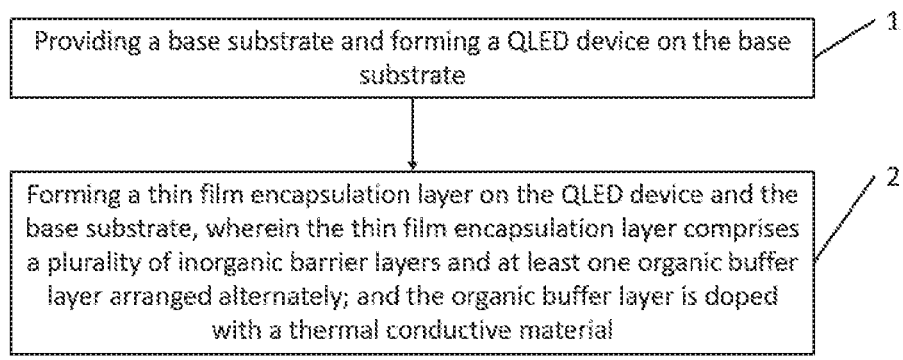
FIG. 1 is a flow chart of the QLED device packaging method of the present disclosure.
Figure 2:
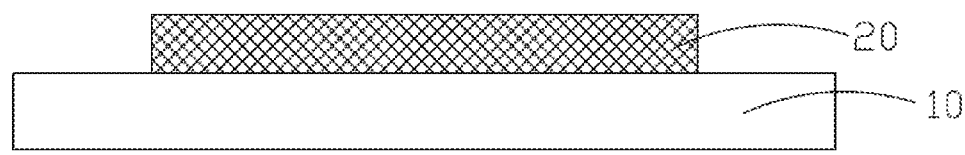
FIG. 2 is a schematic diagram of step 1 of the method for packaging the QLED device of the present disclosure.
Figure 3:
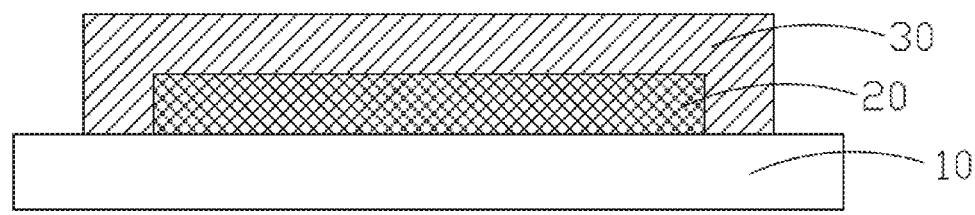
FIG. 3 to FIG. 6 are schematic diagrams of step 2 of the packaging method of the QLED device of the present disclosure.
Figure 4:
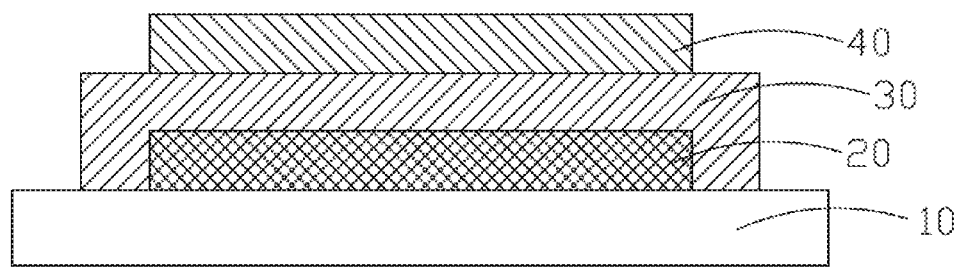

Please refer to FIG. 1 to FIG. 5, the present disclosure provides a method for packaging a QLED device, including the following steps:

Step 1, as shown in FIG. 2, providing a base substrate 10, a forming a QLED device 20 on the base substrate 10.

Specifically, the base substrate 10 is a TFT substrate and includes a plurality of thin film transistors (not shown) arrayed to drive the QLED device 20 to emit light.

Step 2, as shown in FIG. 3 to FIG. 6, forming a thin film encapsulation layer 50 on the QLED device 20 and the base substrate 10; wherein the thin film encapsulation layer 50 includes a plurality of inorganic barrier layers 30 and at least one organic buffer layer 40 arranged alternately; and the organic buffer layer 40 is doped with a thermal conductive material.

Specifically, the specific method of forming the thin film encapsulation layer 50 in step 2 further includes forming an inorganic barrier layer 30 on the QLED device 20 and the base substrate 10; forming an organic buffer layer 40 on the inorganic barrier layer 30; repeating the above manufacturing steps to form a thin film encapsulation layer 50 with a plurality of inorganic barrier layers 30 and at least one organic buffer layer 40 arranged alternately.

Specifically, one of the top layers of the thin film encapsulation layer 50 is the inorganic barrier layer 30. That is, the number of the inorganic barrier layers 30 is one more than the organic buffer layer 40.

Specifically, the material of the inorganic barrier layer 30 is a combination of one or more of silicon oxide, silicon nitride and aluminum oxide, such as aluminum oxide ($Al_2O_3$), silicon nitride (SiNx). The inorganic barrier layer 30 may be formed by plasma enhanced chemical vapor deposition (PECVD), atomic layer deposition (ALD), or sputtering. The thickness of the inorganic barrier layer 30 is 500-2000 nm.

Specifically, the thermal conductive material is graphene oxide.

Specifically, the method of forming the organic buffer layer 40 includes after the thermal conductive material and the organic substance mixing in the organic solvent to form a mixture, forming the organic layer on the inorganic barrier layer 30 by screen printing, spin coating, inkjet printing or film casting, then, curving the organic film layer by UV light irradiation or heating and obtaining the organic buffer layer 40.

Specifically, the thickness of the organic buffer layer 40 is 500-2000 nm.

It should be pointed out that when the light emitted by the QLED needs to be emitted from one side of the film encapsulation layer, the mass fraction of the heat conductive material in the organic buffer layer is less than or equal to 5%, so as to ensure the light transmissivity of the encapsulation structure.

Specifically, the organic material is a combination of one or more of epoxy resin, silicon-based polymer and polymethylmethacrylate. The organic solvent can be selected from volatile organic solvents, such as ethanol, toluene, phenol, or anisole.

It should be noted, the packaging method of the QLED device of the present disclosure forming the thin film encapsulation layer 50 including a plurality of inorganic barrier layers 30 and at least one organic buffer layer 40 arranged alternately on the QLED device 20 achieves the seal of the QLED device 20 to prevent the damage of water and oxygen. Wherein the inorganic barrier layer 30 is an effective barrier layer of water and oxygen. However, some pinholes or particles are generated during the preparation of the inorganic barrier layer 30. The role of the organic buffer layer 40 is to cover the defects of the inorganic barrier layer 30. The organic buffer layer 40 can also release the stress between the inorganic barrier layers 30 to achieve planarization. In addition, the organic buffer layer 40 is doped with graphene oxide having high thermal conductivity, so that the heat generated by the QLED device 20 can be promptly transmitted through the thin film encapsulation layer 50. Thereby enhancing the heat dissipation of the thin film encapsulation layer 50 and further improving the light extraction efficiency and the service life of the QLED device 20.

Figure 5:
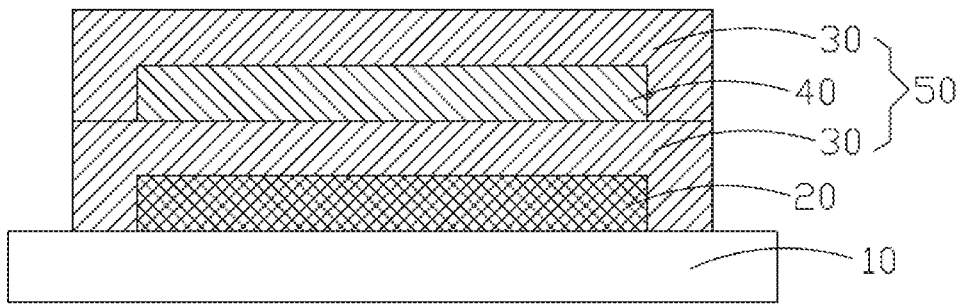
Figure 6:
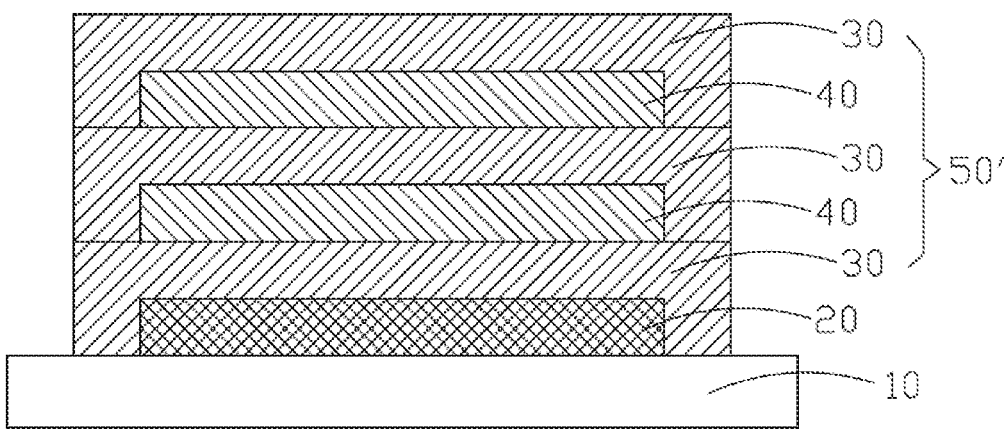

In the packaging method of the QLED device, the thin film encapsulation layer 50 alternately stacked with three layers of an inorganic barrier layer, an organic buffer layer, and an inorganic barrier as shown in FIG. 5 may be formed according to the actual situation or needs. The thin film encapsulation layer 50' may also be alternately stacked with five layers of an inorganic barrier layer, an organic buffer layer, an inorganic barrier layer, an organic buffer layer and an inorganic barrier layer as shown in FIG. 6, in order to enhance the sealing of the thin film encapsulation layer, which is not limited herein.

Figure 7:
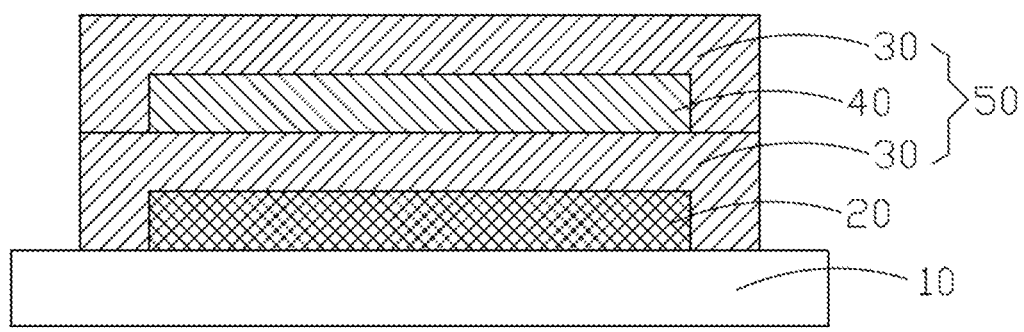
FIG. 7 and FIG. 8 are schematic diagrams of the package structure of the QLED device of the present disclosure.
Figure 8:
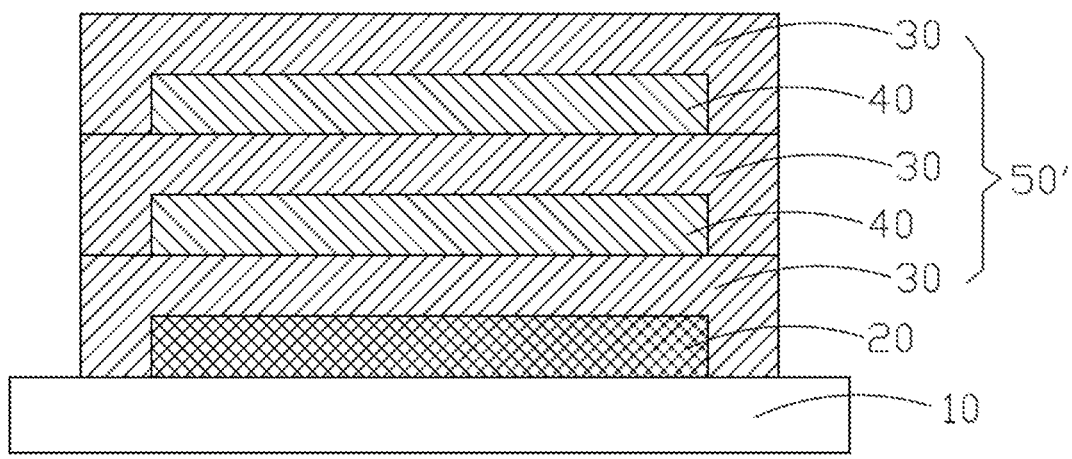

Please refer to FIG. 7 or FIG. 8, on the basis of the packaging method of the QLED device described above, the present disclosure further provides a package structure of a QLED device, including:

a base substrate 10;

a QLED device 20 arranged on the base substrate 10; and a thin film encapsulation layer 50 arranged on the base substrate 10 and covers the QLED device 20.

Wherein the thin film encapsulation layer 50 includes a plurality of inorganic barrier layers 30 and at least one organic buffer layer 40 arranged alternately. The organic buffer layer 40 is doped with a thermal conductive material.

One of the thin film encapsulation layers 50 near the QLED device 20 is an inorganic barrier layer 30.

One of the top layers of the thin film encapsulation layer 50 is the inorganic barrier layer 30. That is, the number of the inorganic barrier layers 30 is one more than the organic buffer layer 40.

The thermal conductive material is graphene oxide.

The organic substance in the organic buffer layer 40 is a combination of one or more of epoxy resin, silicon-based polymer and polymethylmethacrylate.

It should be pointed out that when the light emitted by the QLED device 20 needs to be emitted from one side of the film encapsulation layer 50, the mass fraction of the heat conductive material in the organic buffer layer 40 is less than or equal to 5%, so as to ensure the light transmissivity of the thin film encapsulation layer 50.

The thickness of the organic buffer layer 40 is 500-2000 nm.

The material of the inorganic barrier layer 30 is a combination of one or more of silicon oxide, silicon nitride and aluminum oxide, such as aluminum oxide ($Al_2O_3$), silicon nitride (SiNx).

The thickness of the inorganic barrier layer 30 is 500-2000 nm.

It should be noted, the package structure of the QLED device of the present disclosure, the thin film encapsulation layer 50 including a plurality of inorganic barrier layers 30 and at least one organic buffer layer 40 arranged alternately on the QLED device 20 achieves the seal of the QLED device 20 to prevent the damage of water and oxygen. Wherein the inorganic barrier layer 30 is an effective barrier layer of water and oxygen. However, some pinholes or particles are generated during the preparation of the inorganic barrier layer 30. The role of the organic buffer layer 40 is to cover the defects of the inorganic barrier layer 30. The organic buffer layer 40 can also release the stress between the inorganic barrier layers 30 to achieve planarization. In addition, the organic buffer layer 40 is doped with graphene oxide having high thermal conductivity, so that the heat generated by the QLED device 20 can be promptly transmitted through the thin film encapsulation layer 50. Thereby enhancing the heat dissipation of the thin film encapsulation layer 50 and further improving the light extraction efficiency and the service life of the QLED device 20.

In the package structure of the QLED device, the thin film encapsulation layer 50 alternately stacked with three layers of an inorganic barrier layer, an organic buffer layer, and an inorganic barrier as shown in FIG. 7 may be formed according to the actual situation or needs, The thin film encapsulation layer 50' may also be alternately stacked with five layers of an inorganic barrier layer, an organic buffer layer, an inorganic barrier layer, an organic buffer layer and an inorganic barrier layer as shown in FIG. 8, in order to enhance the sealing of the thin film encapsulation layer, which is not limited herein.

In summary, the method for packaging a QLED device provided by the present disclosure forms a thin film encapsulation layer in which a plurality of inorganic barrier layers and at least one organic buffer layer are alternately stacked on a QLED device to seal the QLED device against water and oxygen, and the organic buffer layer is further doped with a thermal conducting material, so that the heat generated by the QLED device can be promptly transmitted through the thin film encapsulation layer to improve the heat dissipation of the thin film encapsulation layer, thereby improving the light extraction efficiency and the service life of the QLED device.

It should be understood by those skilled in the art that various modifications and variations can be made in the light of the technical solutions and technical concepts of the present disclosure. All such changes and modifications shall fall within the protection scope of the appended claims of the present disclosure.

What is claimed is:

1. A method for packaging a QLED device, comprising the following steps:
   Step 1, providing a base substrate and forming a QLED device on the base substrate; and
   Step 2, forming an inorganic barrier layer on the QLED device and the base substrate; forming an organic buffer layer on the inorganic barrier layer; repeating the above manufacturing steps to form a thin film encapsulation layer with a plurality of inorganic barrier layers and at least one organic buffer layer arranged alternately, wherein the organic buffer layer is doped with a thermal conductive material;
   wherein the method of forming the organic buffer layer comprises forming an organic film layer on the inorganic barrier layer by screen printing, spin coating, inkjet printing or film casting with a mixture of a thermal conductive material, an organic substance and an organic solvent, and curing the organic film layer to obtain the organic buffer layer; wherein the organic substance is a combination of one or more of an epoxy resin, a silicon-based polymer and polymethylmethacrylate, and the organic solvent is ethanol, toluene, phenol, or anisole.

2. The method for packaging the QLED device according to claim 1, wherein the thermal conductive material is graphene oxide; and the mass fraction of the thermal conductive material in the organic buffer layer is less than or equal to 5%.

3. The method for packaging the QLED device according to claim 1, wherein the thickness of the organic buffer layer is 500-2000 nm.

4. A method for packaging a QLED device, comprising the following steps:
   Step 1, providing a base substrate and forming a QLED device on the base substrate;
   Step 2, forming an inorganic barrier layer on the QLED device and the base substrate, forming an organic buffer layer on the inorganic barrier layer, repeating the above manufacturing steps to form a thin film encapsulation layer with a plurality of inorganic barrier layers and at least one organic buffer layer arranged alternately, wherein the organic buffer layer is doped with a thermal conductive material;
   wherein the thermal conductive material is graphene oxide; and the mass fraction of the thermal conductive material in the organic buffer layer is less than or equal to 5%;
   wherein the method of forming the organic buffer layer comprises forming an organic film layer on the inorganic barrier layer by screen printing, spin coating, inkjet printing or film casting with a mixture of a thermal conductive material, an organic substance and an organic solvent, and curing the organic film layer to obtain the organic buffer layer; wherein the organic substance is a combination of one or more of an epoxy resin, a silicon-based polymer and polymethylmethacrylate, and the organic solvent is ethanol, toluene, phenol, or anisole; and
   wherein the thickness of the organic buffer layer is 500-2000 nm.

* * * * *